United States Patent
McLellan et al.

(10) Patent No.: US 8,120,170 B2
(45) Date of Patent: Feb. 21, 2012

(54) INTEGRATED PACKAGE CIRCUIT WITH STIFFENER

(75) Inventors: Neil R. McLellan, Toronto (CA); Vincent K. Chan, Richmond Hill (CA); Roden R. Topacio, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 12/110,798

(22) Filed: Apr. 28, 2008

(65) Prior Publication Data

US 2008/0197477 A1  Aug. 21, 2008

Related U.S. Application Data

(62) Division of application No. 11/469,194, filed on Aug. 31, 2006, now abandoned.

(51) Int. Cl.
*H01L 23/48* (2006.01)
*H01L 21/56* (2006.01)

(52) U.S. Cl. ............ 257/712; 257/E23.14; 257/E23.01; 257/E21.503; 257/E21.506; 257/690; 257/713; 257/717; 257/729; 257/676; 257/675; 257/710; 257/704; 257/707

(58) Field of Classification Search .................. 257/712, 257/713, 717, 720, 676, 675, 710, 704, 707, 257/690, E21.503, E21.506, E23.01, E23.14; 438/107

See application file for complete search history.

(56) References Cited

U.S. PATENT DOCUMENTS

| | | | |
|---|---|---|---|
| 5,148,265 A | 9/1992 | Khandros et al. | |
| 5,219,629 A | 6/1993 | Sobolev | |
| 5,347,159 A | 9/1994 | Khandros et al. | |
| 5,710,071 A | 1/1998 | Beddingfield et al. | |
| 5,841,194 A | 11/1998 | Tsukamoto | |
| 6,465,893 B1 | 10/2002 | Khandros et al. | |
| 6,503,821 B2 * | 1/2003 | Farquhar et al. | 438/613 |
| 6,737,750 B1 | 5/2004 | Hoffman et al. | |
| 6,744,131 B1 * | 6/2004 | Hoang et al. | 257/704 |
| 6,821,823 B2 * | 11/2004 | Xie et al. | 438/127 |
| 6,940,154 B2 | 9/2005 | Pedron et al. | |
| 6,987,032 B1 | 1/2006 | Fan et al. | |
| 6,995,460 B1 | 2/2006 | McLellan | |
| 7,102,085 B2 * | 9/2006 | Ohta et al. | 174/260 |
| 7,115,988 B1 * | 10/2006 | Hool | 257/713 |
| 7,166,917 B2 * | 1/2007 | Yang et al. | 257/724 |
| 7,173,329 B2 * | 2/2007 | Frutschy et al. | 257/698 |
| 7,723,831 B2 * | 5/2010 | Kwang et al. | 257/685 |
| 2002/0105070 A1 | 8/2002 | Shibamoto et al. | |
| 2002/0140085 A1 * | 10/2002 | Lee et al. | 257/724 |

(Continued)

OTHER PUBLICATIONS

"Flip-Chip or Flipchip Assembly," downloaded from www.siliconfareast.com/flipchipassy.htm on Sep. 11, 2006.

(Continued)

*Primary Examiner* — A O Williams
(74) *Attorney, Agent, or Firm* — Faegre Baker Daniels LLP

(57) ABSTRACT

An integrated circuit package employs a stiffener layer that houses a passive electronic component to maintain mechanical properties when a thinner substrate is used. The use of either a retention wall or a stiffener allows for the manufacture of these integrated circuit package using strip, matrix, or array technology where a larger board with a plurality of integrated circuit packages is produced industrially and then cut to individual units.

16 Claims, 7 Drawing Sheets

U.S. PATENT DOCUMENTS

| | | | |
|---|---|---|---|
| 2002/0142513 | A1 | 10/2002 | Fee et al. |
| 2003/0090000 | A1 | 5/2003 | Caletka et al. |
| 2004/0036159 | A1 | 2/2004 | Bruno |
| 2004/0065963 | A1 | 4/2004 | Karnezos |
| 2004/0067606 | A1 | 4/2004 | Fehr et al. |
| 2005/0121757 | A1 | 6/2005 | Gealer |
| 2005/0242447 | A1 | 11/2005 | Killer et al. |
| 2006/0051912 | A1 | 3/2006 | Chan |
| 2008/0178463 | A1* | 7/2008 | Okubora .................. 29/830 |
| 2008/0251875 | A1* | 10/2008 | Wu et al. ................ 257/434 |
| 2008/0284003 | A1* | 11/2008 | Kwang et al. .............. 257/724 |
| 2009/0057873 | A1* | 3/2009 | Hsu .............................. 257/700 |

OTHER PUBLICATIONS

Chylak, Bob et al.; Packaging for Multi-Stack Die Applications; Semiconductor International; www.reed-electronics.com; Jun. 1, 2004; pp. 1-5.

Method for a spacer-less stack-die package design by dual-side wire bonding; May 7, 2003.

* cited by examiner

INTEGRATED PACKAGE CIRCUIT WITH STIFFENER

CROSS-REFERENCE TO RELATED APPLICATION

The present patent application is a divisional of U.S. patent application Ser. No. 11/469,194, filed Aug. 31, 2006 now abandoned, and entitled Flip-Chip Ball Grid Array Strip and Package, which prior application is hereby incorporated herein by reference.

FIELD OF THE INVENTION

The present invention generally relates to integrated circuit packaging and more particularly to a flip-chip ball grid array integrated circuit strips and packages and methods of making thereof.

BACKGROUND OF THE INVENTION

Most electronics rely on integrated circuit technology. A thin substrate of semi-conductor made of passive elements and electronic circuits is miniaturized to form what is known as a microchip, a microprocessor, or a chip. Leads initially in the form of pins or wires have been progressively replaced by factory applied solder balls and shaped by surface tensions of liquid solder balls. These balls are generally arranged on the chip in an array over a single surface. Chips mounted with solder balls are generally referred to as Flip Chips. Flip Chip structures are typically mounted on a substrate which contains interconnect circuitry to facilitate connecting the solder balls (or bumps) on the chip to larger more widely spaced solder balls on the other side of the substrate. This allows for the resulting Flip Chip BGA package to be compatible with the wider spacing geometries of typical mother board (or PCB) design rules. During the mounting process of the Flip Chip on a substrate, the chip is flipped upside-down, giving these chips the name "flip-chips."

Solder balls or bumps are larger than normal wires or pins and improve electrical connection between the chip and the substrate. These balls also provide better thermal conduction from the printed circuit board or substrate to the chip. One downside to flip-chip BGA technology is the reduced access to the area between the solder balls and the complex air gap geometry. This gap is subject to environmental hazards arising from the different thermo-mechanical properties of the silicon chip and the organic substrate material. This can cause large thermally induced stresses on the flip chip solder balls in contact with the substrate. For this reason, a liquid encapsulant is inserted in the area between the flip chip and the substrate and then solidified. This process is called Flip-chip underfilling and is made by placing a liquefied encapsulant with a needle next to the underfill area at the edge of the chip to dispense the material at the base of the flip-chip. Capillary action, in association with liquid viscosity, seeps the dispensed encapsulant inwards to open spaces. Once the encapsulant is in place, thermal curing is performed to create a permanent bond. While different techniques are known to prevent the formation of voids in the gap area, the underfilling is a time-consuming process. A less viscous encapsulant may seep at higher rates but is likely to spread on the circuit board in other directions. As die sizes increase, so does the number of solder bumps used to connect the die to the substrate. In some instances, because of characteristics of the encapsulant, the dispensing machine must be used sequentially to place at different time intervals fractions of the needed encapsulant. In some cases 5 to 6 passes of dispense, seep, and dispense again must be taken to form clean void free underfill structures. In the environment where cycle time and dispensing machine is a crucial component of success, what is needed is a new type of package designed to optimize encapsulant underfill operations. Known devices include the placement of underfill encapsulation material around an entire perimeter of the semiconductor die where the material flows toward the center of the die where the time needed to completely fill the space between the die and the substrate is quite long due to successive passes of dispense. What is needed is new device able to reduce the time needed to fill this space by limiting the number of passes of dispense needed.

Flip Chip BGA substrates are generally made of successive layers of conductive material supported and insulated using insulating materials called dielectrics. One of the most common high-end substrates is BT buildup, made of a flame-resistant organic comprising a woven fiberglass mat impregnated with flame resistant BT resin. Substrates, while offering significant rigidity once the layers have been bonded together, are generally sold in 1600 micron or 800 micron standard thicknesses. The use of a rigid substrate is needed since these boards are often subject to a wide range of manufacturing steps designed to transform a basic substrate into a finished product to be used in the industry, called an integrated circuit package (FCBGA). Illustratively, during this process, substrates may be etched, laminated, drilled, cut, plated, soldered, silk screened, and subjected to chemical masking, coating, bridging, and the like. One advantage of thinner substrates is the ability to use smaller drill heads to perforate the substrate. The drilling of smaller holes means that less conductive material is needed to cover the interior of the hole and reduces undesirable impedance, saves manufacturing time, reduces waste, and is more cost effective. These advantages must be weighed against undesirable secondary effects such as warping of the surface of the substrate, difficulty of obtaining a stable surface, and weakening of the substrate during manufacturing operations. Thinner boards have lowered mechanical strength and impede the large scale industrialization of film-chip assemblies in a strip, matrix or array format.

Known devices include, among other things, an integrated circuit package substrate, a plurality of integrated circuit dies attached to the integrated circuit package substrate, and a stiffener strip attached to the integrated circuit package substrate and surrounding two or more of the plurality of integrated circuit dies. What is also needed is a new reinforced BGA substrate package with improved underfilling capacity and a BGA substrate package strip capable of reducing waste during the phases of extraction of the Flip Chip BGA substrates from the BGA substrate package strip. An improved substrate package and method are needed.

BRIEF DESCRIPTION OF THE DRAWINGS

The features of the present disclosure are believed to be novel and are set forth with particularity in the appended claims. The disclosure may best be understood by reference to the following description taken in conjunction with the accompanying drawings, and the figures that employ like reference numerals identify like elements.

DETAILED DESCRIPTION

Figure 1:
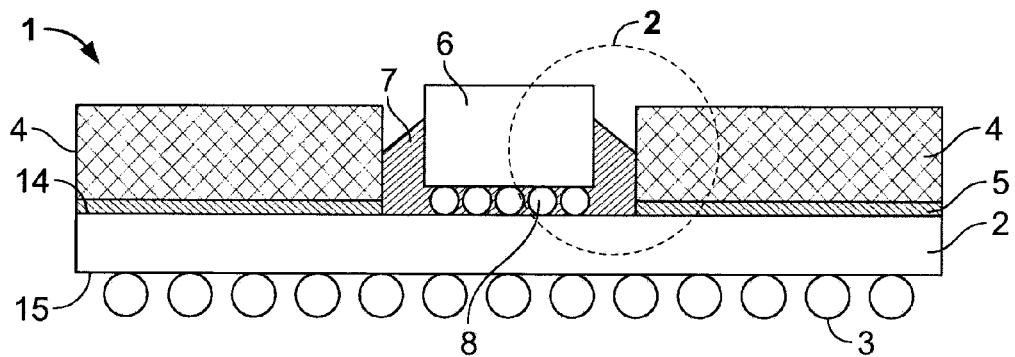
FIG. 1 is a side cross-sectional view of an integrated circuit package in accordance with the teachings of the present disclosure.

In the following detailed description, reference is made to the accompanying drawings that show, by way of illustration, several embodiments of the disclosure, each centered around an improved Flip Chip BGA package and strip and method of manufacturing thereof. These embodiments are described with sufficient detail to enable one skilled in the art to practice the disclosure. It is understood that the various embodiments of the disclosure, although different, are not necessarily exclusive and can be combined differently because they show novel features. For example, a particular feature, structure, step of manufacturing, or characteristic described in connection with one embodiment may be implemented within other embodiments without departing from the spirit and scope of the disclosure. In addition, it is understood that the location and arrangement of individual elements, such as geometrical parameters within each disclosed embodiment, may be modified without departing from the spirit and scope of the disclosure. Other variations will also be recognized by one of ordinary skill in the art. The following detailed description is, therefore, not to be taken in a limiting sense.

The present disclosure relates to an improved integrated circuit package with a encapsulant retention structure located adjacent to a packaged integrated chip on a substrate. The encapsulant retention structure allows for the placement and retention of a larger quantity of encapsulant next to the underfill area allowing the encapsulant to seep under the packaged integrated chip before it is rigidified. The use of an encapsulant reservoir allows for better overall mechanical and thermal properties of the integrated circuit package and reduces the number of encapsulant applications in the localized area around the packaged integrated chip. In one example, a retention wall placed on the substrate alternatively serves as substrate stiffener able to maintain mechanical properties to be used with a more desirable thinner substrate. What is also contemplated is the use of openings and recesses in a stiffener layer of an integrated circuit package to house a passive electronic component to maintain mechanical properties if a thinner substrate is used. The use of either a retention wall or a stiffener allows for the improved manufacture of these integrated circuit packages using strip, matrix, or array technology where a larger board with a plurality of integrated circuit packages is produced and then cut to individual units. The use of a retention wall or a stiffener layer over an expensive substrate layer allows for the use of disposable edges around the strip, including indexing holes or other holding mechanisms. What is also contemplated is a method of manufacture of a compact strip, matrix, or array made of a plurality of integrated circuit packages where little waste or additional cuts are needed to produce individual integrated circuit packages aside from the removal of the disposable edge of the retention wall or stiffener. Within the scope of this disclosure, the term "strip" includes arrangements such as a matrix, array, or linear distribution of adjacent units. What is needed is a new, thinner board with increased mechanical resistance that may be used in large scale industrialization in a cost-effective way. These advantages also reduce undesirable secondary effects such as warping of the surface of the substrate, and difficulty of obtaining a stable surface.

FIG. 1 is a side cross-sectional view of an integrated circuit package in accordance with the teachings of the present disclosure. FIG. 1 shows an integrated circuit ("IC") package 1 with a substrate 2 having a first surface 14 and a second surface 15 in opposition to the first surface 14. While the substrate 2 is shown to be horizontal, it is understood by one of ordinary skill in the art that IC packages 1 are to be used and manufactured, when possible, in any orientation and may include asperities, surface finishes, recesses, grooves, bumps, or even overall irregularly shaped geometries. What is contemplated as a substrate 2 is a BT substrate or any other type of printed wiring boards, etched wiring board, or laminate, made illustratively of one or more layers of ceramic, paper impregnated with phenolic resin such as FR-2, woven fiberglass mat impregnated with a flame retardant epoxy resin such as FR-4, plastic with low dielectric constant such as Teflon, polyimide, polystyrene and cross-linked polystyrene, conductive core layers made of copper, aluminum or other conductive material, polyimide film layers, ceramic-based materials such as bonded copper, and insulated metal and metal-based substrates. In one alternate embodiment, the substrate 2 referred to as a coreless substrate is made of successive layers of an insulating layer, placed in contact with a dielectric layer formed over a circuit layer made of relatively low dielectric constant and good fluidity, such as resin-based material such as ajinomoto build-up film (ABF). However any suitable material may be used. FIG. 1 also shows BGA balls 3 placed under the substrate 2 functionally connected to the second surface 15 along a regular configuration. The BGA balls 3 may be used for carrying power and input/output signals between the elements of the different components attached to the first surface 14 and external devices (not shown). One of ordinary skill in the art will recognize that the substrate 2 may include a bond pad, and a copper bump holder to improve conductivity (not shown). What is also contemplated is any bumping method including but not limited to solder bumping, stud bumping, plate bumping, or even adhesive bumping.

The IC package 1 also includes an encapsulant retention structure 4 coupled to the first surface 14. In one embodiment, a layer of adhesive 5 is used to mechanically couple the encapsulant retention structure 4 to the first surface 14. What is contemplated is the use of any type of adhesive 5 used in the industry including but not limited to natural adhesive, synthetic adhesive, drying adhesives, thermoplastic adhesives, reactive adhesives, pressure sensitive adhesives, or any other commonly used adhesive. The IC package 1 also includes a packaged integrated chip 6 positioned adjacent to the encapsulant retention structure 4 and an encapsulant 7 interposed between at least a portion of the packaged integrated chip 6 and the encapsulant retention structure 4. The encapsulant 7 is in contact with the encapsulant retention structure 4. The encapsulant retention structure 4 in one preferred embodiment acts as a stiffener and is made of woven fiberglass mat impregnated with a flame retardant epoxy resin such as FR-4 or BT resin but it is understood by one of ordinary skill in the art that any low-cost structure, laminated structure, or other insulation material possessing sufficient mechanical strength and thermal resistance, such as polymers, may be placed on the substrate 2 before the chip is reflowed or modified. In one preferred embodiment, the stiffener has a thickness of about 500 to 1000 microns. In yet another preferred embodiment, the stiffener has a thickness less than the thickness of the packaged integrated chip 6 mounted on the substrate 2 with electrical contacts 8. In yet another preferred embodiment (not shown), what is contemplated is the thermal coupling of a thermal diffusion device, such as a heat sink, heat fins, a vapor chamber, or any combination thereof, to the upper area of the packaged integrated chip 6. The packaged integrated chip 6 is a heat-producing structure that can be cooled in a plurality of ways described above.

What is also contemplated is the use of a encapsulant retention structure 4 that is placed or that is made of a plurality of segments, as long as the encapsulant retention structure is able to retain the encapsulant 7 within the area adjacent to the packaged integrated chip 6 where seeping may occur based on fluid dynamics and surface tension determination. The packaged integrated chip 6 is thermally and electrically coupled to the substrate 2 via a series of electrical contacts 8 or bumps. These electrical contacts 8, shown in FIG. 1 as small spheres, are made of electrically conductive material, serve various functions, and are obtained by a process generally known as flip-chip bumping. While bumps are shown, it is understood by one of ordinary skill in the art that any system made of a plurality of electrical contacts 8, including but not limited to pins and leads, may be used. The packaged integrated chip 6 as shown in FIG. 1 may be an IC die, a microprocessor, a network processor, or a transceiver having a silicon substrate or any other miniaturized electronic circuit placed on a insulating platform and housed within a package. In one preferred embodiment, the encapsulant is initially placed by an underfilling needle based dispensation system along the edges of the packaged integrated chip 6 between the packaged integrated chip 6 and the encapsulant retention structure 4. The encapsulant as shown in FIG. 1 occupies the area located between the plurality of electrical contacts 8. The encapsulant 7 is used to thermally couple the packaged integrated chip 6 to the substrate 2 and to protect the coupling zone and the electrical contact 8 from environmental hazards. In one preferred embodiment, the encapsulant is an underfill typically used in underfilling processes, and the underfill may be made of the snap cure, low profile, high performance, or reworkable types. What is contemplated is, at a minimum, any commercially available material sold for underfill applications that can be used in conjunction with the present invention and any commercially available dispensing equipment that may be used to practice the invention.

Figure 2:
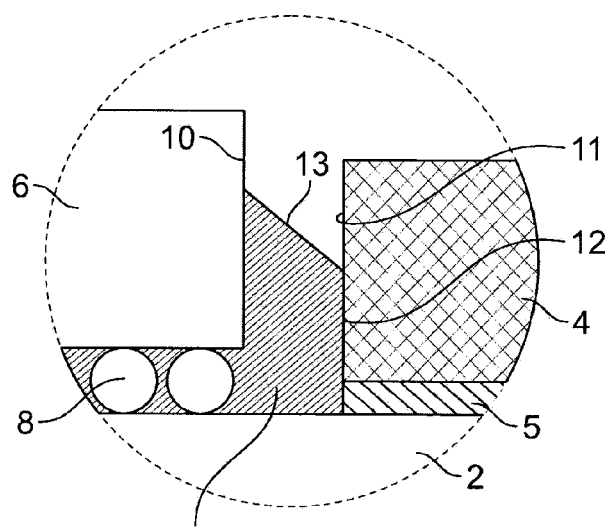
FIG. 2 is a enlarged fragmentary cross-sectional view of the integrated circuit package as shown by section 2 on FIG. 1 in accordance with the teachings of the present disclosure.

FIG. 2 is an enlarged fragmentary cross-sectional view of the integrated circuit package as shown by section 2 in FIG. 1 in accordance with the teachings of the present disclosure. What is contemplated is the insertion of a liquid underfill 7 as shown in FIG. 2 between the encapsulant retention structure 4 and the packaged integrated chip 6 where the encapsulant 7 is initially located at a first level (not shown). As seeping occurs, the encapsulant 7 migrates between the electrical contacts 8 to fill a void located beneath the packaged integrated chip 6. As the seeping advances, the level 13 will lower and eventually stabilize at a position shown in FIG. 2. A portion of the side wall 10 of the packaged integrated chip 6 is then located above the level 13, a section 12 of the encapsulant retention structure 4 is located below the level 13, and a second section 11 of the encapsulant retention structure 4 is located above the level 13. It is understood by one of ordinary skill in the art that while the encapsulant retention structure 4 shown is a layer placed on the substrate 2 fixed with the adhesive 5, any stiffener, ribbing structure, hollowed network, pods, or small pillar is contemplated. In one preferred embodiment, the packaged integrated chip 6 has a side wall 10, and the encapsulant 7 is in contact with the side wall 10 and the encapsulant retention structure 4.

In a preferred embodiment, the substrate 2 has a thickness of about 70 to 400 microns. In a more preferred embodiment, the substrate has a thickness of about 400 microns. It is understood by one of ordinary skill in the art what while a specific thickness is disclosed as a preferred or more preferred embodiment, the object of the present disclosure is to reduce the thickness of the substrate 2 as much as possible. The invention as contemplated is equally applicable to a thickness of substrates 2 of less than 70 microns. In another embodiment, the substrate may be a thin core substrate, a substrate with no core, or a polyimide tape substrate.

Figure 3:
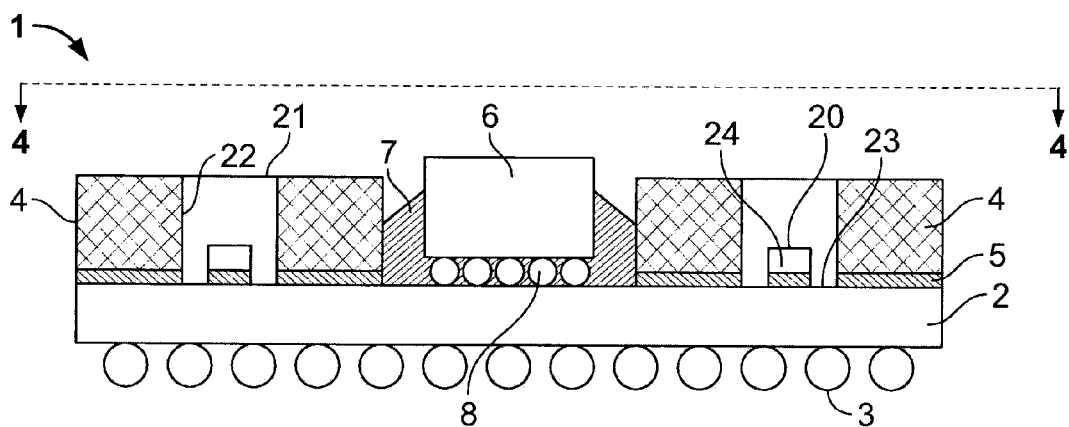
FIG. 3 is a side cross-sectional view of an integrated circuit package with openings for passive electronic elements in according to another embodiment of the present disclosure as shown on FIG. 4 along the cut line 4-4.
Figure 4:
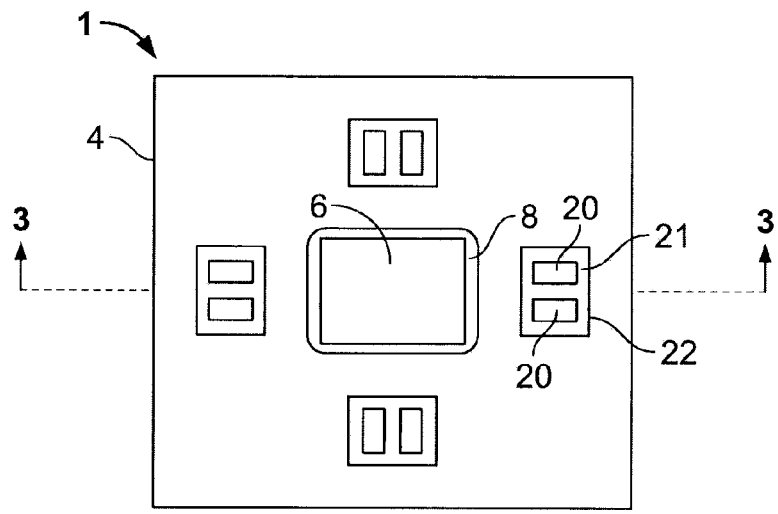
FIG. 4 is a top view of the integrated circuit package with openings for passive electronic elements shown on FIG. 3 along the cut line 3-3.
Figure 5:
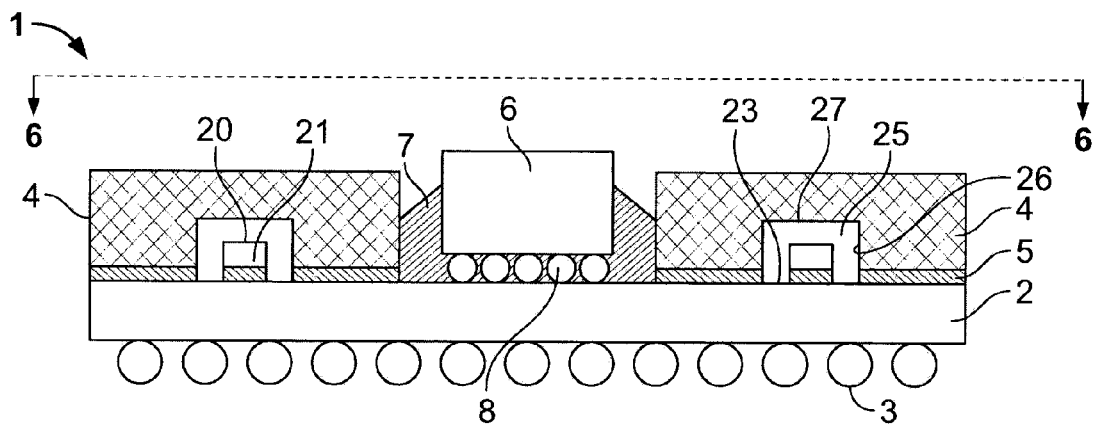
FIG. 5 is a side cross-sectional view of an integrated circuit package with recessed openings for passive electronic elements in accordance with another embodiment of the present disclosure.
Figure 6:
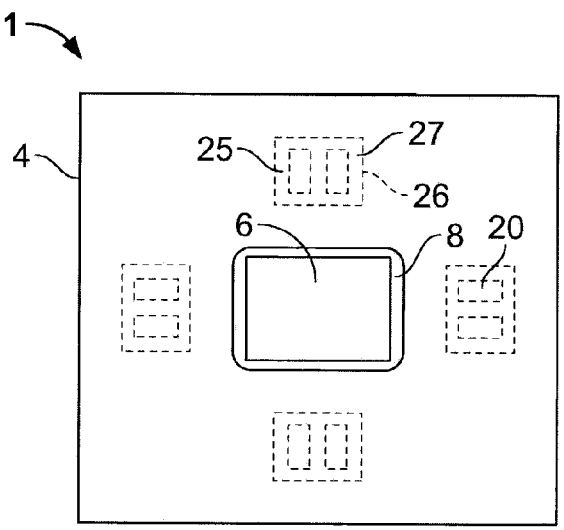
FIG. 6 is a top view of the integrated circuit package with recessed openings for passive electronic elements shown on FIG. 5 along the cut line 6-6.

FIG. 3 shows a side cross-sectional view of an integrated circuit package with openings for passive electronic elements in accordance with another embodiment of the present disclosure. The integrated circuit package 1 has a substrate 2, a packaged integrated chip 6 coupled to the substrate 2, and at least one passive electronic component 20 coupled to the substrate 2. The stiffener 4 has a top surface 21 and a bottom surface 23, the bottom surface 23 being coupled to the substrate 2 with a adhesive 5. The stiffener 4 surrounds or partly surrounds the at least one passive electronic component 20. The previously described features and characteristics and contemplated uses of the electrical contacts 8, the encapsulant 7, the adhesive 5 and other elements, along with the BGA balls 3 as shown in FIG. 3, are used throughout the scope of this disclosure and are made equally applicable to every embodiment by association. FIG. 3 is a cross-sectional view of the integrated circuit package shown in FIG. 4. In one preferred embodiment, a rectangular opening 22 is made in the stiffener 4 as shown in FIG. 4 surrounding the at least one passive electronic component 20. FIGS. 4, 6, 8, and 13 each illustrate preferred embodiments where a integrated circuit package 1 is rectangular in shape and includes a packaged integrated circuit 6 also of rectangular configuration along a horizontal plane. While rectangular configurations are generally preferred in this art, what is contemplated is any geometrical configuration. FIG. 3 shows a configuration where the opening made in the stiffener 4 is a rectangular hole throughout the full height of the stiffener 4. In yet another preferred embodiment shown in FIGS. 5 and 6, what is also contemplated is a recessed section 26 of a lesser thickness 27 than the stiffener 4 made in the bottom surface 23 of the stiffener 4. While two possible embodiments are shown, what is contemplated is the use of any opening made in the stiffener 4 that surrounds or partly surrounds the at least one passive electronic component 20, including but not limited to direct molding of the stiffener over the passive electronic component 20, the pressure insertion of the passive electronic component 20 into a viscous stiffener material, or the machining of an opening of any geometry able to surround the passive electronic component 20. In a preferred embodiment, the passive electronic component 20 is a pair of capacitors placed on each of four lateral sides of the packaged integrated circuit 6. What is also contemplated is the progressive removal of the capacitance capacity as improvements and inductance levels are reduced to ultimately change to a situation where the capacitance capacity requires fewer capacitors. What is contemplated in the present disclosure is the use of a plurality openings, holes, recesses, and other cavities made in the stiffener during manufacturing to maintain the optimal mechanical resistance of a thinned substrate 2 with the use of a layer of substrate 2. What is also contemplated is any known fixation method for functionally coupling a passive electronic component 20 to the substrate 2 shown as reference 21 in FIG. 5, including but not limited to the use of the above-described disclosure where an encapsulant is placed within the rectangular opening 22 used as a retention wall.

Figure 7:
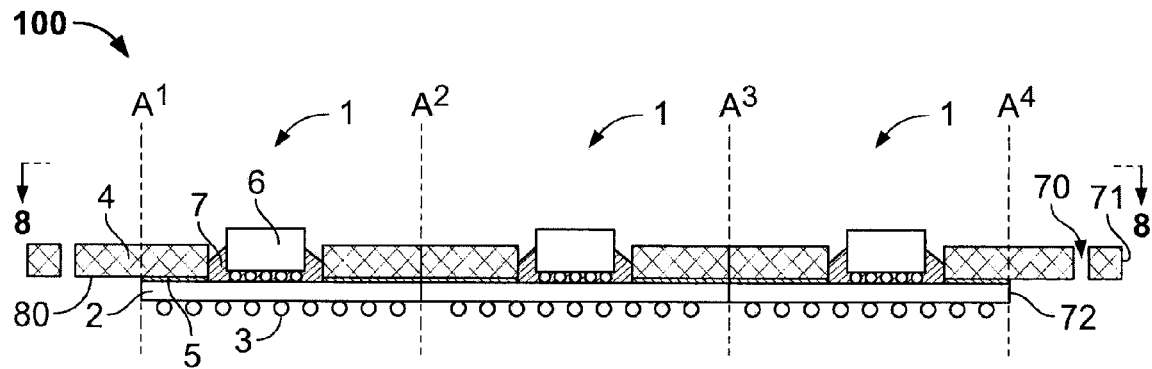
FIG. 7 is a side cross-sectional view of an integrated circuit package strip in accordance with another embodiment of the present disclosure as shown on FIG. 8 along the cut line 7-7.
Figure 8:
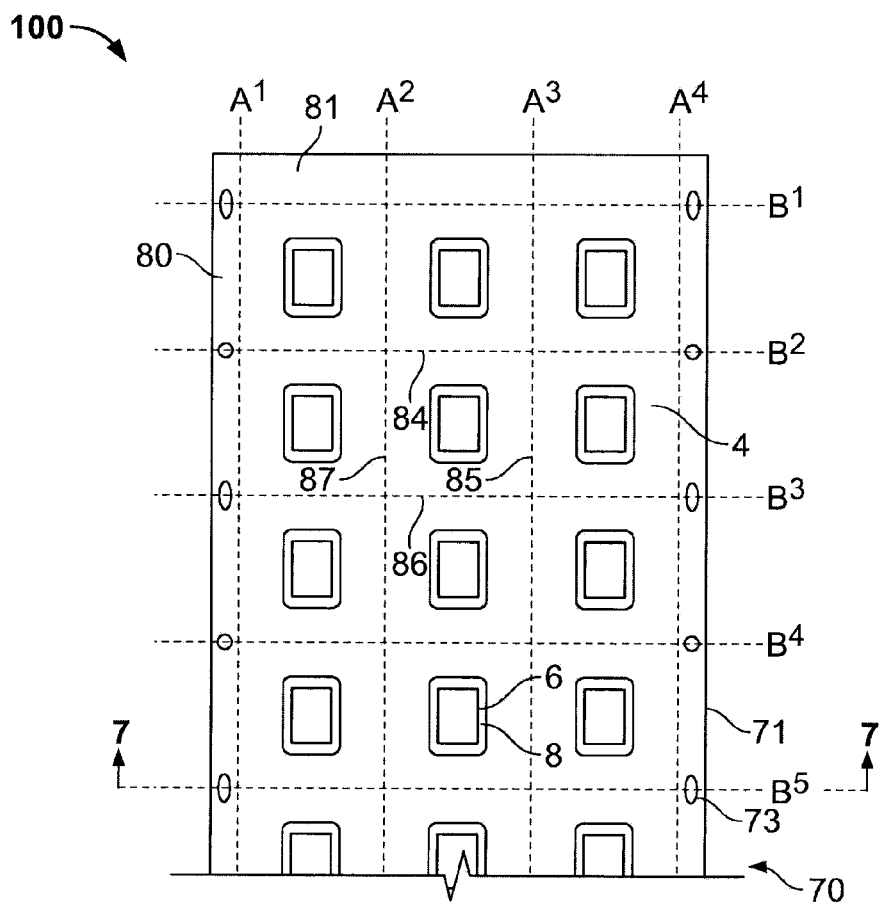
FIG. 8 is a partial top view of the integrated circuit package strip shown on FIG. 7.

Turning to FIG. 7, what is shown is a side cross-sectional view of an integrated circuit package strip in accordance with another embodiment of the present disclosure as shown in FIG. 8. An integrated circuit package strip 100 is made of a plurality of integrated circuit packages 1, shown individually in FIGS. 1-6 according to several preferred embodiments. Each integrated circuit package 1 is arranged on a plane along a strip 71. The integrated circuit packages 1 comprise a substrate 2 with a first surface 14 as shown in FIG. 1, a packaged integrated chip 6 coupled to the first surface 14, a stiffener 4 surrounding the packaged integrated chip 6 further coupled to the first surface 14, and at least one integrated circuit package 1 in the strip 71 having four lateral sections perpendicular to the plane and sharing at least two of the four lateral sections with different integrated circuit package along the strip 71. FIGS. 7 and 8 show cut lines A1 to A4 along a longitudinal direction of the strip 71 and cut lines B1 to B5 along a latitudinal direction of the strip 71. These cut lines are shown on the strip 71 to indicate the position of the integrated circuit packages 1 after each package is cut from the strip using conventional cutting methods such as but not limited to saw singulated cutting techniques or punch singulated techniques. In one preferred embodiment, each package is cut from the strip using a saw singulated technique. In the preferred embodiment shown in FIG. 8, a 3-by-5 matrix or array of integrated circuit packages 1 is shown, and what is contemplated as the preferred disclosed embodiment is a 3-by-10 matrix. One of ordinary skill in the art will recognize that while a 3-by-10 matrix is shown and disclosed, what is contemplated is any arrangement of integrated circuit packages 1 including but not limited to a strip of one dimension or a two-dimensional array. What is disclosed is a strip 100 where each of the four lateral sections 84, 85, 86, 87 around each integrated circuit package 1 shown as the preferred embodiment are produced as the result of the manufacturing process but are disposed in contact with adjacent integrated circuit packages to form a tight configuration where a minimum number of cuts is needed to separate the integrated circuit packages 1 from the strip 100. FIG. 7 shows a preferred embodiment where the encapsulant retention structure 4 or the stiffener is of greater planar dimension than the substrate 2 creating a circumferential edge 80, which is better shown in FIG. 8. The circumferential edge 80 is used during the manufacturing process to manipulate the substrate 4 and guiding means used to center and position the substrate 2 next to the encapsulant retention structure 4. FIG. 7 shows a series of indexing holes 70 made in the circumferential edge 80, but what is contemplated is any guiding means, including but not limited to notches, pins, geometric variations, thickness variations, magnetic locks, or other similar devices known in the art. In one preferred embodiment, the outer cuts, namely cuts A1, A4, and B1, are designed to separate the circumferential edge 80 from the center region of the strip 100 and align the outer edge 71 of the strip 100 with the substrate 2. In a preferred embodiment, tolerances observed are around 75 microns or less between the outer edge of the substrate 2 and the outer edge of the stiffener 4. What is also shown is a configuration where the packaged integrated chip 6 is centered in the middle of each integrated circuit package 1, and alternatively but not shown, where openings for a passive electronic component 20 are also centered between the packaged integrated chip 6 and the lateral edge. It is understood by one of ordinary skill in the art that the arrangement of the different elements and components on the substrate 2 within each integrated circuit package 1 may be different according to functional needs, thermal requirements, or even mechanical resistance obligations.

Figure 13:
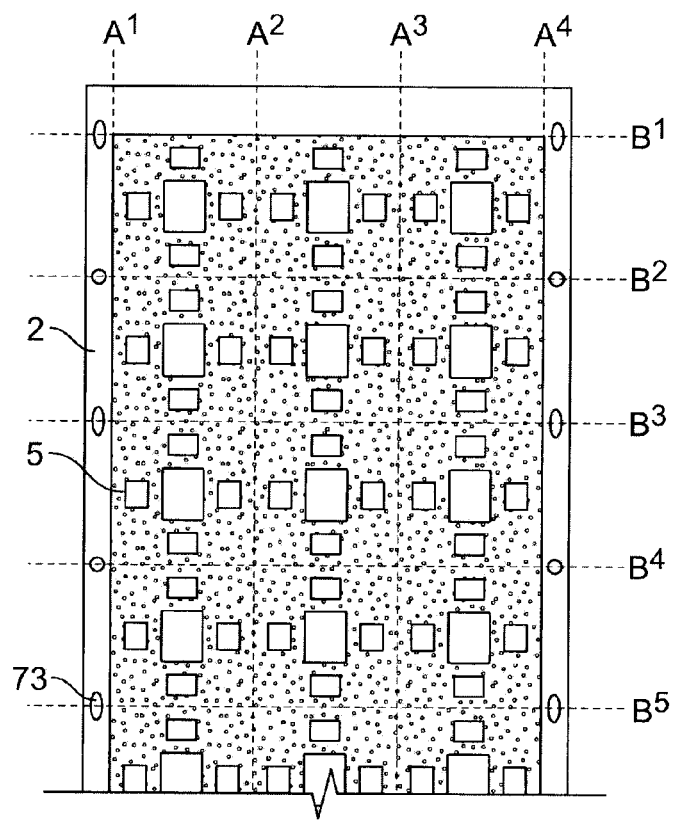
FIG. 13 is a bottom view of the stiffener material used in the method for making an integrated package strip in accordance with FIGS. 9-12 as shown on FIG. 12 along the cut line 13-13.

FIG. 13 shows as a preferred embodiment the location of the adhesive 5 placed upon the surface of the stiffener or a encapsulant retention structure 4 in accordance with the above described embodiments. It is understood that while the adhesive 5 is shown as a significant layer on the different embodiments of this disclosure, a thin layer of adhesive is used based on bonding properties of the selected adhesive 5 in the process. In the preferred embodiment shown in FIG. 13, the circumferential edge 80 is not covered with the adhesive 5, but since the circumferential edge 80 is to be separated and discarded during cutting operations, the placement of adhesive 5 over the entire surface of the stiffener 4 is also contemplated.

Figure 9:
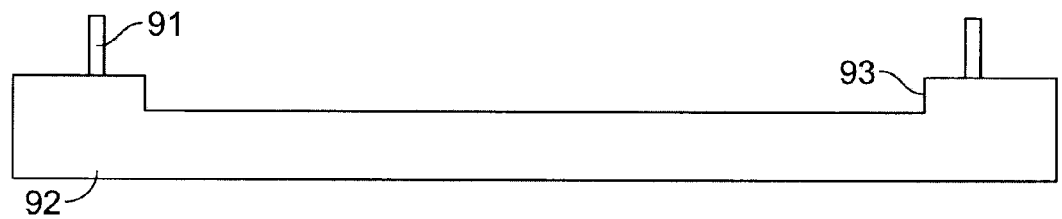
FIGS. 9-12 are elevation schematic views of a method for making an integrated package strip in accordance with an embodiment of the present disclosure.
Figure 10:
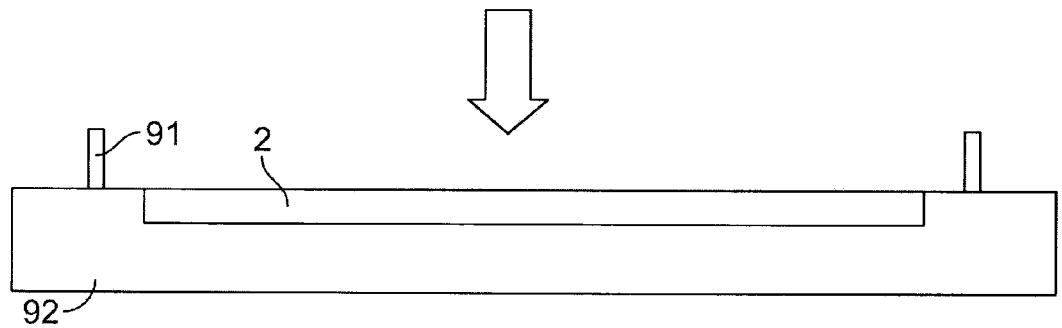

FIGS. 9 to 12 are elevation schematic views of a method for making an integrated package strip in accordance with an embodiment of the present disclosure where each elevation represents a different successive step in the process of making the integrated package strip of the present disclosure. FIGS. 9 and 10 show a layer of substrate 2 as it is inserted in an alignment structure such as an alignment boat 92. In a preferred embodiment, a recess 93 made in the alignment structure 92 holds the substrate both longitudinally and laterally with edges of a thickness sufficient to house the substrate 2. In yet another preferred embodiment, a series of tooling pins 91 are placed on the alignment structure 92 to receive the stiffener 4.

Figure 11:
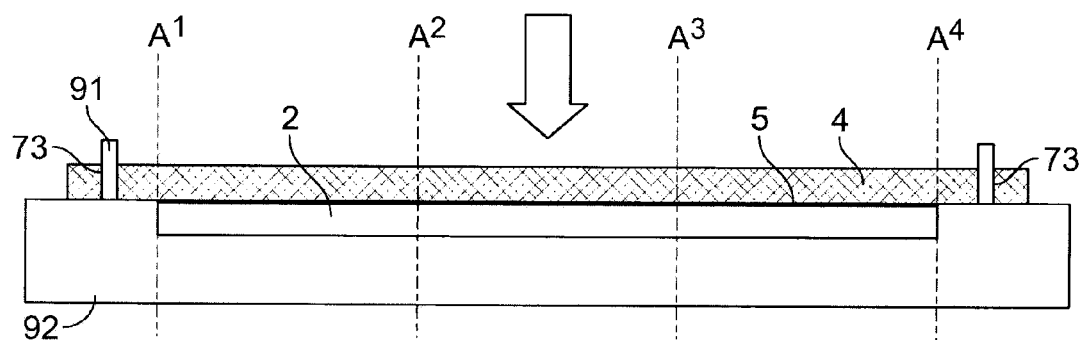
Figure 12:
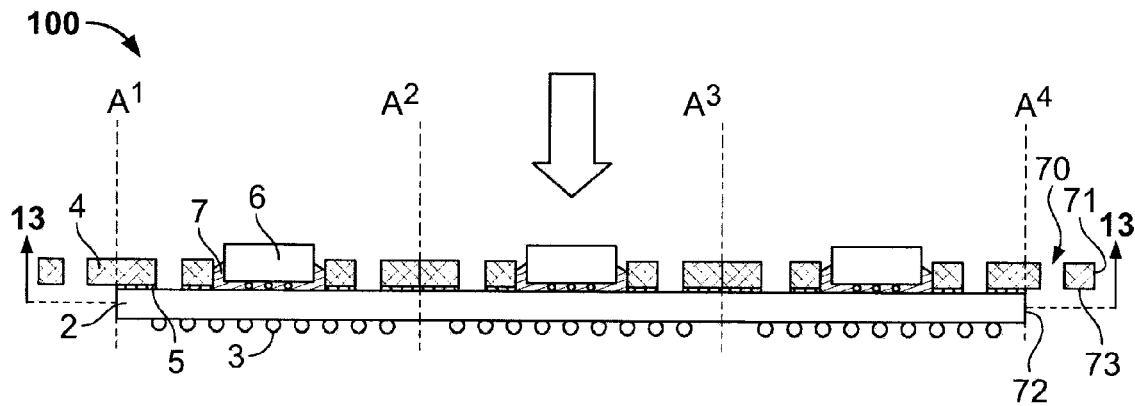
Figure 14:
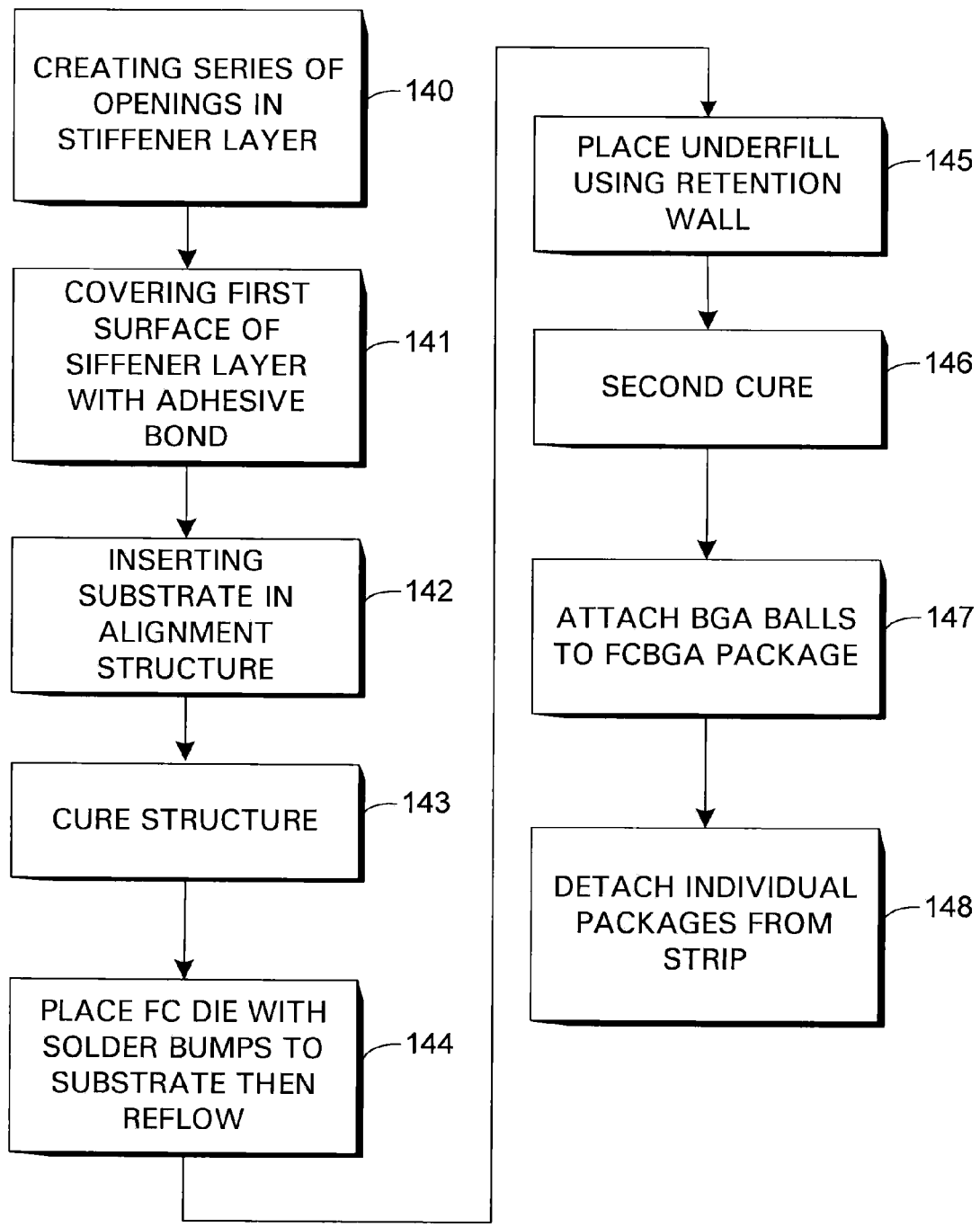
FIG. 14 is a diagram of a method for making an integrated package strip in accordance to an embodiment of the present disclosure.

FIG. 14 is a diagram of the method for making an integrated package strip in accordance to an embodiment of the present disclosure where each step is shown in succession. The first surface is covered 141 as shown in FIG. 11 and diagrammed on FIG. 14 by a stiffener 4 layer with an adhesive 5. The substrate 2 is then inserted 142 in the alignment structure 92. The stiffener 4 is then placed on the substrate on the alignment structure so the first surface is in contact with the substrate. The stiffener 4 may, in an alternate embodiment, comprise a series of indexing holes 73 for placement of the stiffener layer over the alignment boat 92. FIG. 12 shows the strip 100 where a series of openings are made 140 in the stiffener layer to house a packaged integrated chip 6. The edge of the stiffener layer 80 may then be cut to remove the indexing holes 73 or any other holding or guiding means. The packaged integrated chip 6 may then be functionally coupled 144 in each opening after a cure by placing the integrated chip 6 and solder bumps on the substrate before reflow. In yet another embodiment, a series of opening may be created in the stiffener layer to house a passive electronic component 20 coupled to the substrate 2. An underfill is placed using the retention wall 145 before a second cure 146 is conducted. The BGA balls 3 are then attached 147 to the FCBGA package. Finally, the individual package chip 6 may be detached from the packaged strip 100. Another embodiment of the method of making an integrated circuit package strip includes creating a series of openings in a stiffening layer 140, covering a first surface of a stiffener layer 4 with an adhesive 141, inserting 142 a substrate 4 in an alignment structure 92, conducting a first cure of the structure, placing 143 the integrated circuit chip 6 and solder bumps on the substrate 2, conducting a reflow 144 of the structure, placing an underfill 7 using a retention wall 145, conducting a second cure 146 of the structure, attaching 147 BGA balls 3 to an integrated circuit package in the strip, and detaching 148 each individual integrated circuit packages from the strip 100. In an alternate embodiment, the detaching 148 of each individual integrated circuit packages from the strip 100 is conducted before the BGA balls 3 are attached 147 to an integrated circuit package from the strip.

Figure 15:
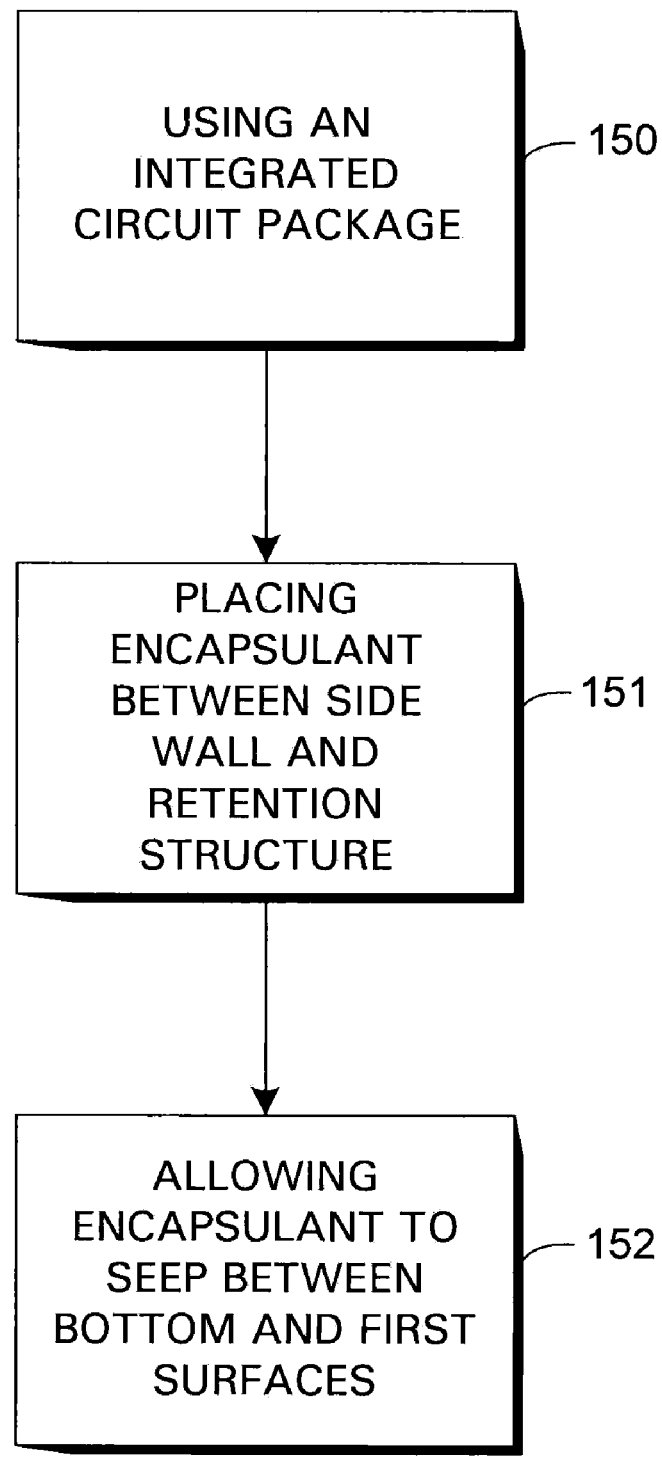
FIG. 15 is a diagram of a method for making an integrated package in accordance to an embodiment of the present disclosure.

FIG. 15 is a diagram of a method for making an integrated package in accordance to an embodiment of the present disclosure. In another embodiment, what is contemplated is a method of making an integrated circuit package, the method includes the step of using 150 an integrated circuit package 1 equipped with a substrate 2 with a first surface 14 and a second surface 15 in opposition to the first surface 14, an encapsulant retention structure 4 coupled to the first surface 14, and a packaged integrated chip 6 with a side wall 10 positioned adjacent to the encapsulant retention structure 4 also having a bottom surface 23 at a distance from the first surface 14. The method further includes the step of placing 151 an encapsulant 7 between the side wall 10 and the encapsulant retention structure 4, and allowing 152 the encapsulant 7 to seep between the bottom surface and the first surface 14. In a preferred embodiment, the encapsulant 7 is placed in a single operation, but it is understood by one of ordinary skill in the art that what is contemplated is a reduction of normal operations during the placement of the encapsulant 7 in the integrated circuit package 1.

The invention as disclosed herein is not limited to the particular details of the package, strip, or method of manufacture depicted, and other modifications and applications may be contemplated. Further changes may be made in the above-described method and device without departing from the true spirit and scope of the invention herein involved. It is intended, therefore, that the subject matter in the above disclosure should be interpreted as illustrative, not in a limiting sense.

What is claimed is:

1. An integrated circuit package, comprising:
   a substrate;
   a packaged integrated chip coupled to the substrate;
   at least one passive electronic component coupled to the substrate; and
   a stiffener comprising a top surface and a bottom surface, the bottom surface coupled to the substrate and having a space_at least partly surrounding the at least one passive electronic component.

2. The integrated circuit package of claim 1, wherein the bottom surface is recessed and houses the at least one passive electronic component.

3. The integrated circuit package of claim 1, wherein the stiffener is comprised of a epoxy resin reinforced with a woven fiberglass mat.

4. The integrated circuit package of claim 1, wherein the substrate has a thickness of about 70 to 400 microns.

5. The integrated circuit package of claim 1, wherein the substrate has a thickness of about 400 microns.

6. The integrated circuit package of claim 1, wherein the substrate is a thin core substrate structure.

7. The integrated circuit package of claim 1, wherein the substrate is a substrate structure with no core.

8. The integrated circuit package of claim 1, wherein the substrate is a polyimide tape substrate.

9. The integrated circuit package of claim 1, wherein the package insulated circuit is integrated in a flip-chip ball grid array.

10. The integrated circuit package of claim 1, wherein stiffener has a thickness of about 500 to 1000 microns.

11. The integrated circuit package of claim 10, wherein the packaged integrated chip has a thickness greater than the thickness of the stiffener.

12. The integrated circuit package of claim 11, wherein a heat sink is attached to a top side of the packaged integrated chip.

13. The integrated circuit package of claim 1, wherein the at least one passive electronic component is a capacitor.

14. The integrated circuit package of claim 1, comprising an encapsulant interposed between at least a portion of the packaged integrated chip and the stiffener and in contact with the stiffener.

15. The integrated circuit package of claim 1 wherein the packaged integrated chip is located in a recess in the stiffener and wherein the stiffener is configured to form an encapsulant retention structure for the packaged integrated chip.

16. An integrated circuit package, comprising:
   a substrate;
   a packaged integrated chip coupled to the substrate;
   at least one passive electronic component coupled to the substrate;
   a stiffener comprising a top surface and a bottom surface, the bottom surface coupled to the substrate and at least partly surrounding the at least one passive electronic component; and
   wherein the stiffener is comprised of a epoxy resin reinforced with a woven fiberglass mat.

* * * * *